United States Patent
Nagami (10) Patent No.: US 9,324,287 B2
(45) Date of Patent: Apr. 26, 2016

(54) LIQUID CRYSTAL DISPLAY DEVICE

(71) Applicant: Japan Display Inc., Tokyo (JP)

(72) Inventor: Takahiro Nagami, Mobara (JP)

(73) Assignee: Japan Display Inc., Tokyo (JP)

( * ) Notice: Subject to any disclaimer, the term of this patent is extended or adjusted under 35 U.S.C. 154(b) by 75 days.

(21) Appl. No.: 13/719,293

(22) Filed: Dec. 19, 2012

(65) Prior Publication Data

US 2013/0154912 A1 Jun. 20, 2013

(30) Foreign Application Priority Data

Dec. 19, 2011 (JP) ................................ 2011-277235

(51) Int. Cl.
| | |
|---|---|
| *G09G 3/36* | (2006.01) |
| *G02F 1/1335* | (2006.01) |
| *G02F 1/1362* | (2006.01) |
| *G02F 1/1343* | (2006.01) |

(52) U.S. Cl.
CPC ........ *G09G 3/3648* (2013.01); *G02F 1/133504* (2013.01); *G02F 1/133553* (2013.01); *G02F 1/136227* (2013.01); *G02F 1/133555* (2013.01); *G02F 1/134363* (2013.01); *G02F 2001/134318* (2013.01)

(58) Field of Classification Search
CPC ....... G09G 3/3648; G09G 3/36; G02F 1/1345
USPC .......................................................... 345/92
See application file for complete search history.

(56) References Cited

U.S. PATENT DOCUMENTS

| | | | | |
|---|---|---|---|---|
| 2005/0110932 A1* | 5/2005 | Chang | ............... | G02F 1/134363 349/141 |
| 2006/0055314 A1* | 3/2006 | Nakamura | .......... | H01L 51/0004 313/500 |
| 2006/0152645 A1* | 7/2006 | Song | ................. | G02F 1/133371 349/43 |
| 2008/0023697 A1* | 1/2008 | Cho | .................... | H01L 51/0545 257/40 |
| 2009/0180069 A1 | 7/2009 | Nishimura | | |

(Continued)

FOREIGN PATENT DOCUMENTS

| | | |
|---|---|---|
| JP | 2006-195273 A | 7/2006 |
| JP | 2007-264080 A | 10/2007 |

(Continued)

OTHER PUBLICATIONS

Office Action dated Jul. 28, 2015 regarding a corresponding Japanese Patent Application No. 2011-277235.

*Primary Examiner* — Fred Tzeng
(74) *Attorney, Agent, or Firm* — Typha IP LLC (57) ABSTRACT

A pixel electrode is formed on a TFT substrate, and a gate insulating film is formed thereon. On the gate insulating film, formed is an inorganic passivation film, on which a common electrode having slits is formed. Through-holes are formed in the gate insulating film at areas where the pixel electrode faces the common electrode, and the pixel electrode is not connected to a source electrode in the through-hole. The through-holes are filled with the inorganic passivation film, and the common electrode is formed on the inorganic passivation film at a position corresponding to each through-hole. The pixel electrode faces the common electrode at the position through not the gate insulating film but only the inorganic passivation film, and thus the pixel capacity can be increased. Accordingly, it is possible to prevent changes in the electric potential of the pixel electrode caused by ON/OFF operations.

9 Claims, 9 Drawing Sheets

(56) References Cited

U.S. PATENT DOCUMENTS

| | | | |
|---|---|---|---|
| 2009/0225251 A1* | 9/2009 | Kaitoh | G02F 1/1303 349/46 |
| 2012/0001951 A1* | 1/2012 | Katagawa | G09G 3/3648 345/690 |
| 2012/0081648 A1* | 4/2012 | Nagami | G02F 1/134309 349/139 |
| 2012/0105392 A1* | 5/2012 | Nagami | G02F 1/1345 345/204 |
| 2013/0148061 A1* | 6/2013 | Wang | G02F 1/134309 349/106 |

FOREIGN PATENT DOCUMENTS

| | | |
|---|---|---|
| JP | 2009-139853 A | 6/2009 |
| JP | 2010-156960 A | 7/2010 |
| JP | 2010-256556 A | 11/2010 |

* cited by examiner

LIQUID CRYSTAL DISPLAY DEVICE

CLAIM OF PRIORITY

The present application claims priority from Japanese Patent Application JP 2011-277235 filed on Dec. 19, 2011, the content of which is hereby incorporated by reference into this application.

BACKGROUND OF THE INVENTION

1. Field of the Invention

The present invention relates to a display device, and particularly to an IPS-type liquid crystal display device with excellent viewing angle characteristics.

2. Description of the Related Art

In a liquid crystal display panel used for a liquid crystal display device, there are arranged a TFT substrate on which pixels having pixel electrodes and thin-film transistors (TFTs) are formed in a matrix shape, and an opposed substrate which faces the TFT substrate and on which color filters are formed at positions corresponding to the pixel electrodes of the TFT substrate. In addition, liquid crystal is sandwiched between the TFT substrate and the opposed substrate. The transmittance of light by liquid crystal molecules is controlled for each pixel to form an image.

Liquid crystal display devices are flat and light, and thus have been widely used in various fields. Small-sized liquid crystal display devices have been widely used in cellular phones or DSCs (Digital Still Cameras). There is a problem of viewing angle characteristics in the liquid crystal display device. The viewing angle characteristics are phenomena in which brightness and chromaticity are changed when a screen is viewed from the front direction or oblique direction. An IPS (In plane Switching)-type liquid crystal display device in which liquid crystal molecules are operated by an electric field in the horizontal direction is excellent in the viewing angle characteristics.

There are many kinds of IPS-type liquid crystal display devices. For example, transmission can be increased by an IPS-type liquid crystal display device in which a common electrode or a pixel electrode is formed in a flat shape, a comb-like pixel electrode or common electrode is arranged thereon while sandwiching an insulating film, and liquid crystal molecules are rotated by electric field generated between the pixel electrode and the common electrode. Thus, the IPS-type liquid crystal display device is currently the mainstream.

In such an IPS type, a TFT is formed first and is covered with a passivation film. On the passivation film, formed are the common electrode, the insulating film, the pixel electrode, and the like in a conventional technique. However, the numbers of conductive films and insulating films in the TFT substrate are reduced due to demand of reducing the manufacturing costs.

As another example of the IPS type, FIG. 13 of Japanese Patent Application Laid-Open No. 2009-168878 illustrates a configuration in which a common electrode is formed in the same layer as a gate electrode, and a gate to insulating film and a comb-like pixel electrode are formed while sandwiching a protective insulating film.

Figure 11:
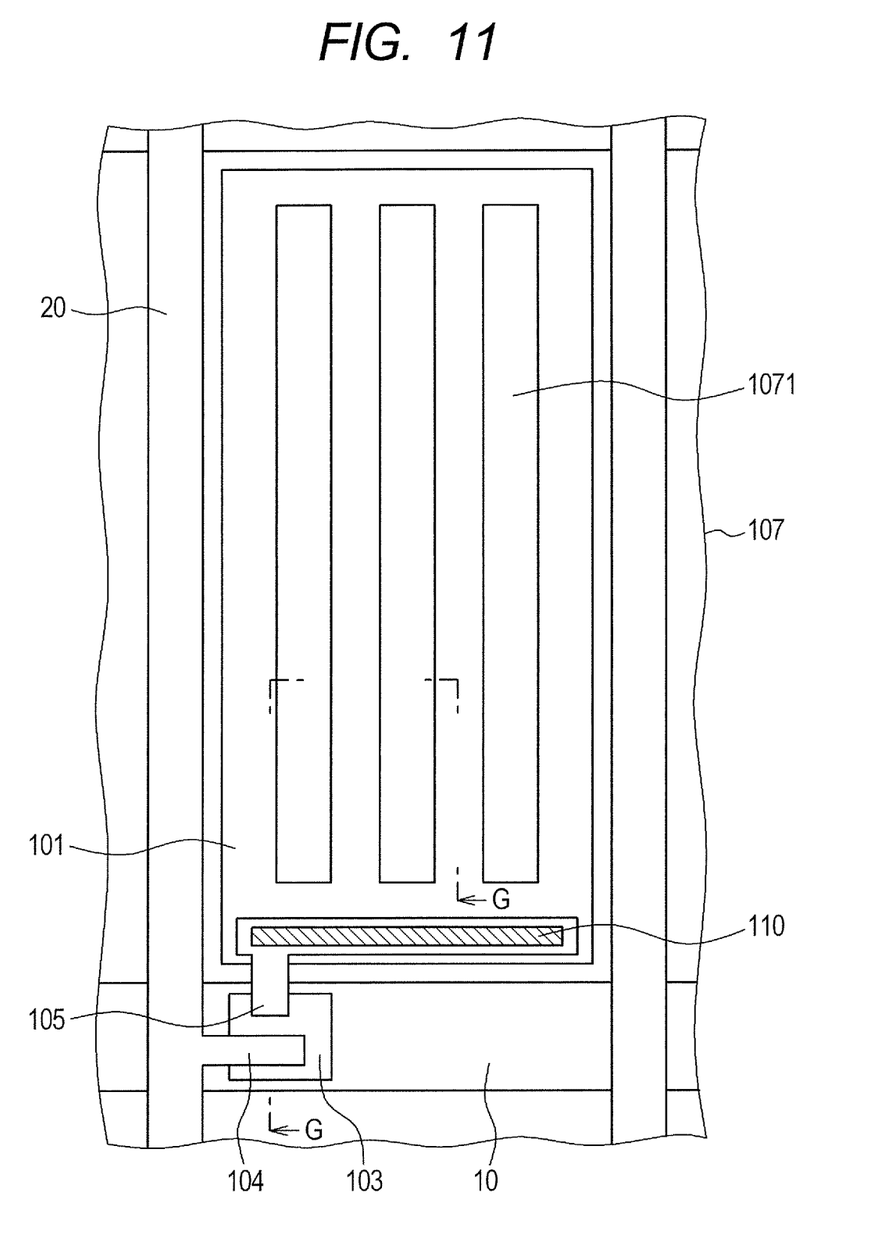
FIG. 11 is a plan view of a pixel of a liquid crystal display device in a conventional example.

FIG. 11 is a plan view for showing an IPS pixel structure targeted by the present invention. In FIG. 11, a pixel is formed in an area surrounded by scanning lines 10 and video signal lines 20. A TFT is formed on the scanning line 10. Specifically, a semiconductor film 103 is formed on the scanning line 10 through a gate insulating film 102, and a drain electrode 104 and a source electrode 105 are formed thereon. In addition, the scanning line 10 also serves as a gate electrode. In the pixel structure as shown in FIG. 12, a pixel electrode 101 connected to the source electrode 105 of the TFT is formed in the lowermost layer, a common electrode 107 is formed in the uppermost layer, and liquid crystal molecules 200 are driven by voltage between the pixel electrode 101 and the common electrode 107.

Figure 10:
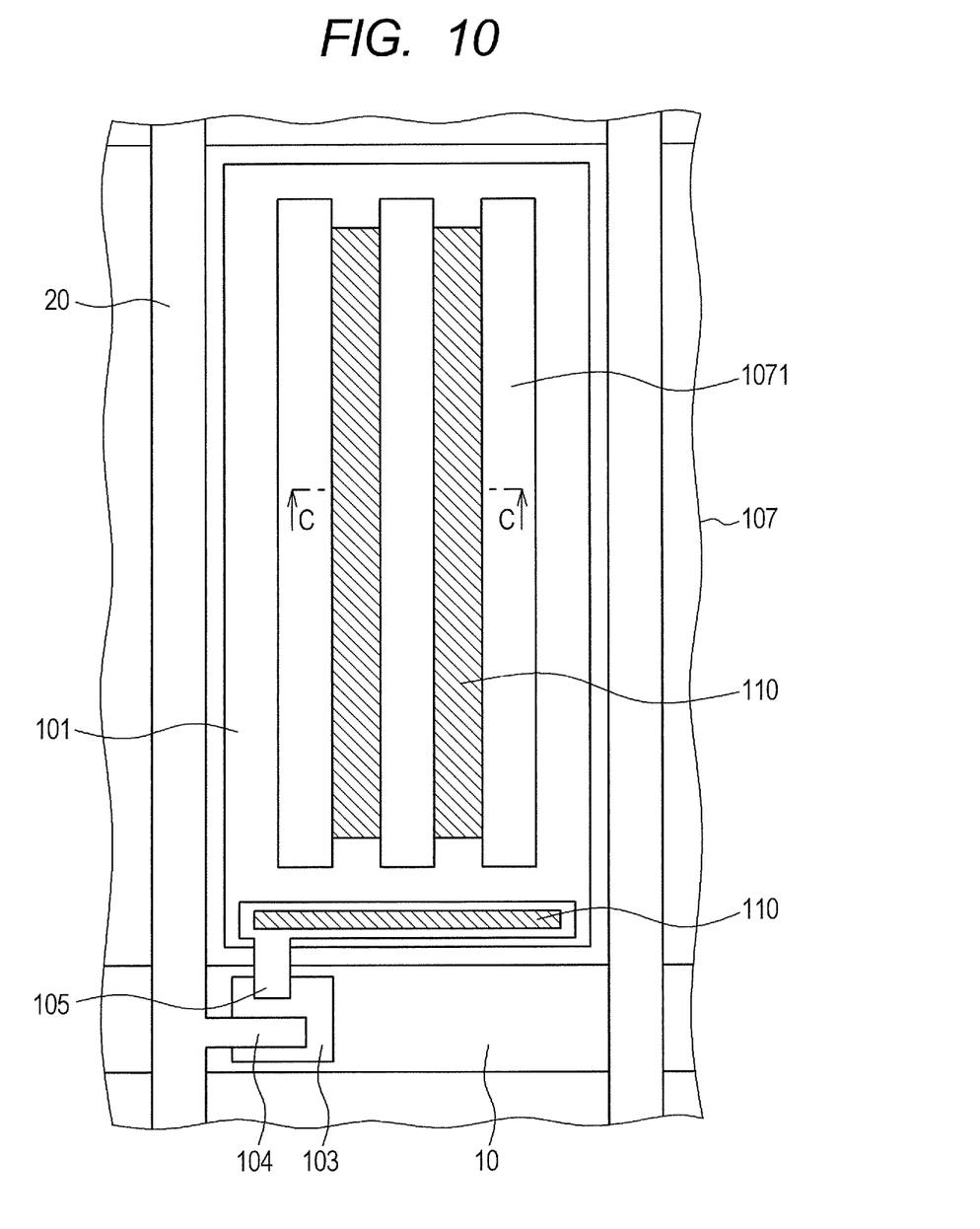
FIG. 10 is a plan view of a pixel of a liquid crystal display device according to another example in the third embodiment.
Figure 12:
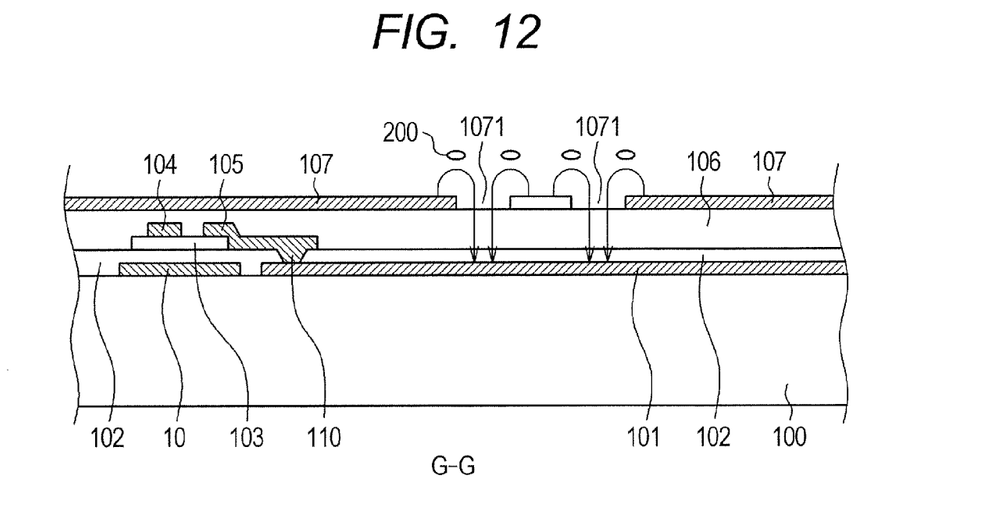
FIG. 12 is a cross-sectional view taken along the line G-G of FIG. 11.

FIG. 12 is a cross-sectional view taken along the line G-G of FIG. 10. In FIG. 12, the gate electrode 10 as the scanning line 10 and the pixel electrode 101 are formed on the TFT substrate 100 made of glass. The gate electrode 10 is formed using a laminated film of Al and AlMo alloy, and the pixel electrode 101 is formed using ITO (Indium Tin Oxide). The gate insulating film 102 is formed while covering the gate electrode 10 and the pixel electrode 101.

On the gate electrode 10 and the gate insulating film 102, there is formed the semiconductor film 103 made of a-Si on which the drain electrode 104 and the source electrode 105 are formed. The source electrode 105 is connected to the pixel electrode 101 through a through-hole 110 formed in the gate insulating film 102. The through-hole 110 is formed in a horizontally-long shape to reduce contact resistance. An inorganic passivation film 106 is formed while covering the drain electrode 104, the source electrode 105, and the like. On the inorganic passivation film 106, the common electrode 107 is formed. Slits 1071 are formed at the common electrode 107. If voltage is applied between the pixel electrode 101 and the common electrode 107, lines of electric force are generated through the slits 1071 and liquid crystal molecules 200 are rotated by the lines of electric force. Thus, the amount of light penetrating through the liquid crystal layer can be controlled. As described above, the IPS type to which the present invention is applied is largely different from the configuration of the liquid crystal display device described in Japanese Patent Application Laid-Open No. 2009-168878.

In the configuration shown in FIG. 12, the number of layers to be formed is small, and the number of photolithography steps is also small. Thus, the structure shown in FIG. 12 is excellent in manufacturing costs. On the other hand, in the case where pixel capacity is formed between the pixel electrode 101 and the common electrode 107 to suppress a voltage shift caused by changes in gate voltage in the TFT, it is disadvantageously difficult to increase the pixel capacity.

Specifically, the pixel capacity is formed between the pixel electrode 101 and the common electrode 107 in FIG. 12, and the gate insulating film 102 and the inorganic passivation film 106 are provided between the pixel electrode 101 and the common electrode 107. The thicknesses of the gate insulating film 102 and the inorganic passivation film 106 are about 300 nm and 500 nm, respectively, and both films are made of SiN. As described above, the pixel capacity is formed through the insulating film with a thickness of 800 nm in total, and thus cannot be sufficiently increased. Accordingly, pixel voltage caused by ON/OFF of gate voltage is largely affected.

An object of the present invention is to solve the above-described problems and to realize an inexpensive IPS-type liquid crystal display device in which the number of laminated films is small and pixel voltage is less shifted.

SUMMARY OF THE INVENTION

The present invention overcomes the above-described problems, and concrete aspects are as follows.

According to the present invention, there is provided a liquid crystal display device including: a TFT substrate on which pixels having pixel electrodes and TFTs are formed in a matrix shape; an opposed substrate having color filters; and liquid crystal sandwiched between the TFT substrate and the opposed substrate, wherein the pixel electrode is formed on the TFT substrate, a gate insulating film is formed on the pixel electrode, an inorganic passivation film is formed on the gate insulating film, and a common electrode having slits is formed on the inorganic passivation film; a video signal is supplied to the pixel electrode from a source electrode of the TFT through a first through-hole of the gate insulating film; a second through-hole is formed in the gate insulating film at a position where the pixel electrode faces the common electrode, and the pixel electrode and the source electrode are not connected to each other in the second through-hole; the inorganic passivation film is formed in the second through-hole; and the common electrode is formed on the inorganic passivation film at an area corresponding to the second through-hole.

According to the present invention, there is provided a liquid crystal display device including: a TFT substrate on which pixels having transmissive areas and reflective areas are formed in a matrix shape; an opposed substrate having color filters; and liquid crystal sandwiched between the TFT substrate and the opposed substrate, wherein in the reflective area, a pixel electrode is formed on the TFT substrate, a gate insulating film is formed on the pixel electrode, and plural through-holes are formed in the gate insulating film; a source electrode extending from the TFT is formed while covering the gate insulating film and the plural through-holes; an inorganic passivation film is formed while covering the source electrode, and a common electrode having slits is formed on the inorganic passivation film; the source electrode is conductive with the pixel electrode in the plural through-holes of the gate insulating film; and the source electrode formed on the gate insulating film and the plural through-holes forms a diffuse reflection surface.

According to the present invention, there is provided a liquid crystal display device including: a TFT substrate on which pixels having pixel electrodes and TFTs are formed in a matrix shape; an opposed substrate having color filters; and liquid crystal sandwiched between the TFT substrate and the opposed substrate, wherein the pixel electrode is formed on the TFT substrate; a gate insulating film is formed while covering the periphery of the pixel electrode; no gate insulating film is provided on the inner side relative to the periphery of the pixel electrode and an inorganic passivation film is directly formed on the pixel electrode; and a common electrode having slits is formed on the inorganic passivation film.

According to the present invention, there is provided a liquid crystal display device including: a TFT substrate on which pixels having pixel electrodes and TFTs are formed in a matrix shape; an opposed substrate having color filters; and liquid crystal sandwiched between the TFT substrate and the opposed substrate, wherein the pixel electrode is formed on the TFT substrate, a gate insulating film is formed on the pixel electrode, an inorganic passivation film is formed on the gate insulating film, and a common electrode having plural slits is formed on the inorganic passivation film; a video signal is supplied to the pixel electrode from a source electrode of the TFT through a first through-hole of the gate insulating film; and an area with the gate insulating film removed is formed at a position where the pixel electrode faces the common electrode, and the inorganic passivation film is directly formed on the pixel electrode at the area with the gate insulating film removed.

According to the present invention, pixel capacity can be increased in an IPS liquid crystal display device in which the number of layers is reduced, and thus changes in the electric potential of a pixel electrode caused by changes in gate voltage can be minimized.

DETAILED DESCRIPTION OF THE EMBODIMENT

Hereinafter, the content of the present invention will be described in detail using embodiments.

First Embodiment

Figure 1:
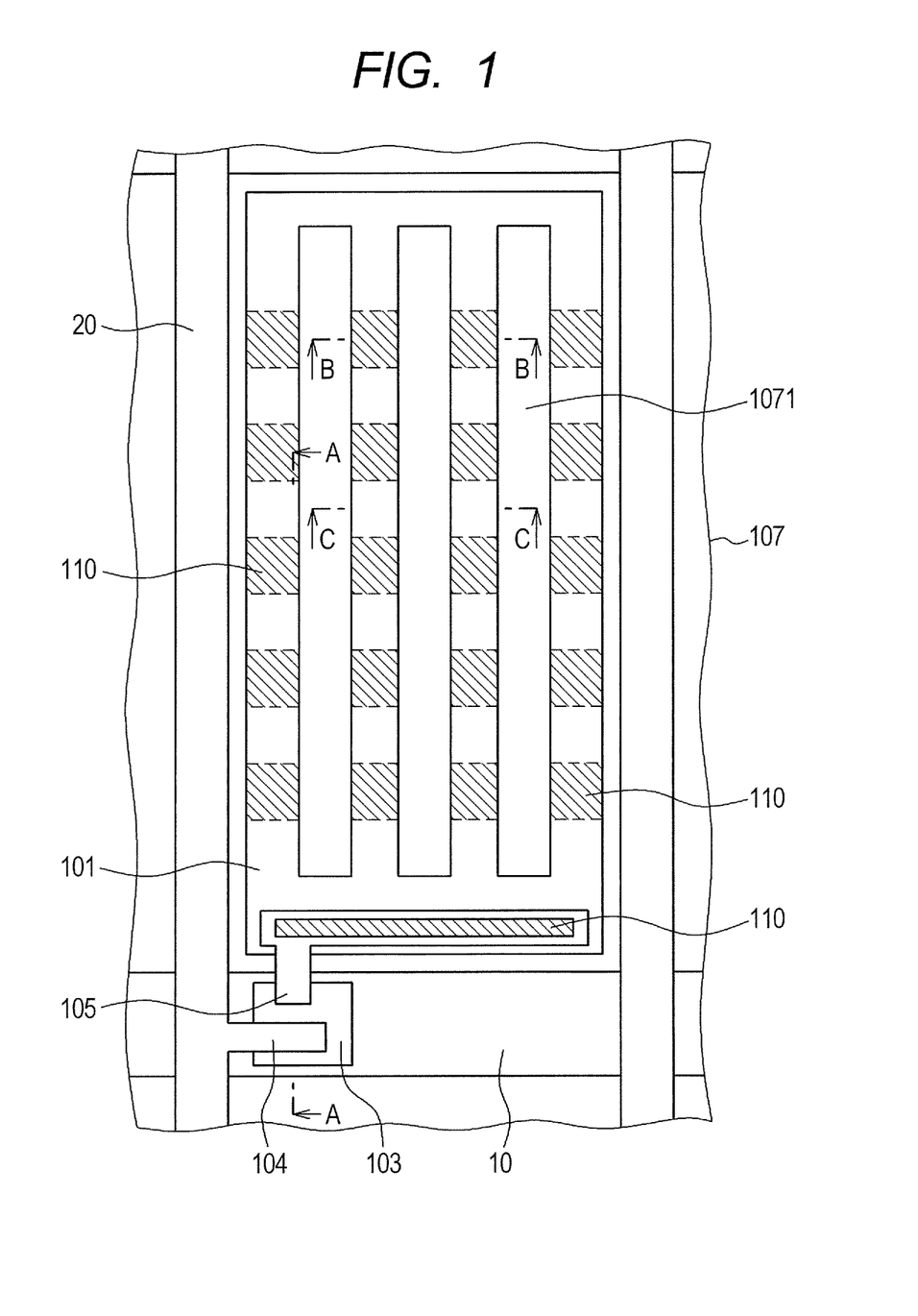
FIG. 1 is a plan view of a pixel of a liquid crystal display device in a first embodiment.
Figure 2:
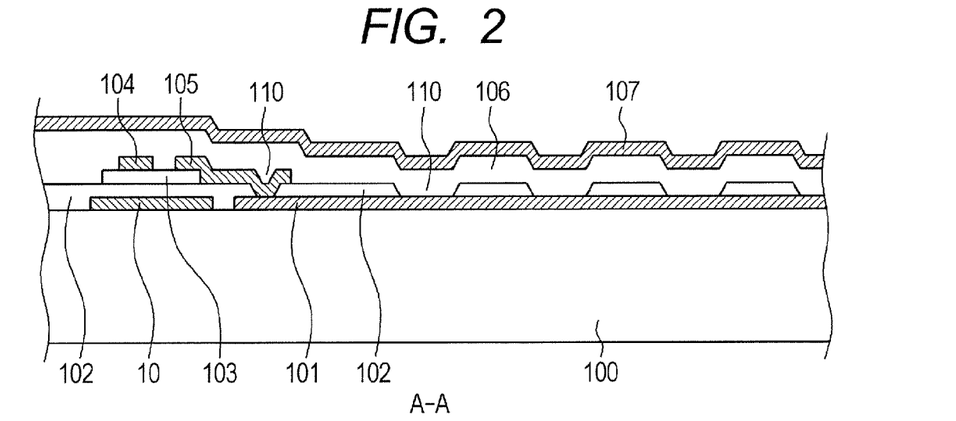
FIG. 2 is a cross-sectional view taken along the line A-A of FIG. 1.

FIG. 1 is a plan view of a pixel part of a liquid crystal display device according to the present invention. The pixel structure is basically the same as that explained in FIG. 11. Specifically, a gate insulating film 102 shown in FIG. 2 is formed on a scanning line 10 that also serves as a gate electrode, and a semiconductor film 103 is formed on the gate insulating film 102. On the semiconductor film 103, a drain electrode 104 diverged from a video signal line 20 and a source electrode 105 are formed. The source electrode 105 is connected to a pixel electrode 101, formed at the lowermost layer, through a through-hole 110.

An inorganic passivation film 106 shown in FIG. 2 is formed while covering the source electrode 105 and the drain electrode 104, and a common electrode 107 is formed on the inorganic passivation film 106. The common electrode 107 has slits 1071. The common electrode 107 covers the whole surface of FIG. 1 except the slits 1071. FIG. 1 is largely different from FIG. 11 in that the through-holes 110 are partially formed in the gate insulating film 102 covering the pixel electrode 101 between the pixel electrode 101 and the common electrode 107, and the distance between the pixel electrode 101 and the common electrode 107 is shortened at the position of each through-hole 110. The area provided with diagonal lines in FIG. 11 denotes the through-hole formed in the gate insulating film. The capacity between the pixel electrode 101 and common electrode 107 is increased at the position where the distance between the pixel electrode 101 and the common electrode 107 is shortened.

In this case, plural through-holes 110 are formed in the gate insulating film 102 at predetermined pitches while being associated with the striped common electrode 107 sandwiched between the slits 1071. However, it is not essential to form the through-holes 110 while being associated with the striped common electrodes 107. The positions and pitches of the through-holes 110 may be arbitrarily set unless the orientation of liquid crystal is affected.

FIG. 2 is a cross-sectional view taken along the line A-A of FIG. 1. First, the pixel electrode 101 is formed on a TFT substrate 100 made of glass. The pixel electrode 101 is formed using ITO by sputtering to have a thickness of, for example, 77 nm to 50 nm. Thereafter, the pixel electrode 101 is patterned. Next, a film for the scanning line 10 that also serves as a gate electrode is formed by sputtering to have a thickness of about 220 nm. The scanning line 10 is formed as, for example, a laminated film in which a lower layer is made of Al having a thickness of about 200 nm and an upper layer is made of AlMo alloy having a thickness of about 20 nm. As described above, the pixel electrode 101 and the scanning line 10 of the same layer are formed on the TFT substrate 100.

Next, the gate insulating film 102 and a-Si as the semiconductor film 103 are continuously formed by CVD. It should be noted that n+a-Si (not shown) used for ohmic contact is also formed continuously with a-Si. The thicknesses of the gate insulating film 102, the a-Si film, and the n+a-Si film are about 300 nm, 150 nm, and 50 nm, respectively.

Next, the semiconductor layer 103 is patterned to be in an island shape as shown in FIG. 1. The semiconductor layer 103 is formed on the gate insulating film 102, and is patterned by photolithography. Thereafter, the through-hole 110 is formed in the gate insulating film 102. The source electrode 105 and the pixel electrode 101 of the TFT can be connected to each other via the through-hole 110.

In the present invention, the through-holes 110 are formed not only for connecting the source electrode 105 to the pixel electrode 101. The through-holes 110 are partially formed in the gate insulating film at areas where the pixel electrode 101 faces the common electrode, and the distance between the pixel electrode 101 and the common electrode 107 is shortened at the position of each through-hole to increase the capacity. The thickness of the gate insulating film is about 300 nm, and thus the distance between the pixel electrode 101 and the common electrode 107 is shortened by the thickness of the gate insulating film, resulting in an increase in the pixel capacity.

The video signal line 20, the drain electrode 104, and the source electrode 105 are formed at the same time. Thereafter, the video signal line 20, the drain electrode 104, and the source electrode 105 are referred to as an SD film in some cases. The SD film is formed using CrMo by sputtering to have a thickness of about 150 to 200 nm, and is patterned by photolithography.

Thereafter, the inorganic passivation film 106 is formed by CVD while covering the drain electrode 104, the source electrode 105, the gate insulating film 102, and the like. The inorganic passivation film 106 is formed using, for example, SiN to have a thickness of as large as about 500 nm. This is because a large thickness is necessary to some extent to function as a passivation film.

Next, the common electrode 107 is deposited. The common electrode 107 is formed using ITO by sputtering to have a thickness of, for example, 77 nm to 50 nm similarly to the pixel electrode 101. Next, the common electrode 107 formed on the whole surface is patterned. The patterning of the common electrode 107 is realized by forming the slits 1071 in the common electrode 107 as shown in FIG. 1 or FIG. 2. Accordingly, after the patterning of the common electrode 107, the common electrode 107 exists on the whole surface except the slits 1071.

When voltage is applied between the pixel electrode 101 and the common electrode 107, the lines of electric force as described in FIG. 11 are generated, and the liquid crystal molecules 200 are rotated. The amount of light that accordingly penetrates through the liquid crystal layer is controlled for each pixel to form an image. It should be noted that an orientation film for initial orientation of liquid crystal formed on the common electrode 107 is not illustrated in FIG. 2. This also applies to other cross-sectional views. An opposed substrate (not shown) on which color filters and the like are formed is arranged so as to face the TFT substrate 100 of FIG. 2 while sandwiching the liquid crystal layer.

The present invention is characterized in that as shown in FIG. 1 and FIG. 2, the through-holes 110 are partially formed in the gate insulating film at areas where the pixel electrode 101 faces the common electrode 107, and the distance between the pixel electrode 101 and the common electrode 107 is shortened at the position of each through-hole to increase the capacity. The thickness of the gate insulating film 102 is about 300 nm. If the thickness of the inorganic passivation film 106 is about 500 nm, the capacity at the position becomes 8/5 times.

Forming the through-holes 110 in the gate insulating film 102 has no impact on the capacity at the positions of the slits 1071. In FIG. 1 and FIG. 2, the through-holes 110 are periodically formed in the gate insulating film 102 at areas where the common electrode 107 faces the pixel electrode 101. This is to prevent irregularities generated by forming the through-holes 110 in the gate insulating film 102 from seriously having an impact on the orientation of the liquid crystal.

Figure 3:
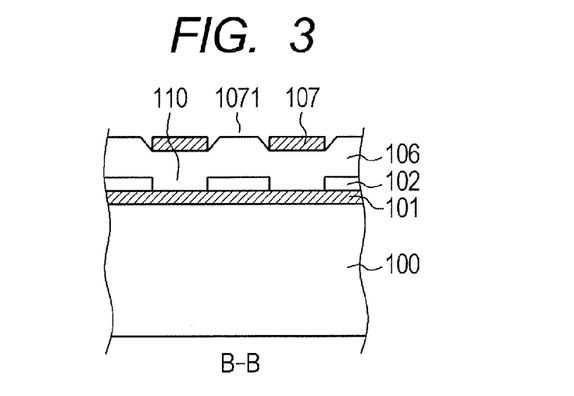
FIG. 3 is a cross-sectional view taken along the line B-B of FIG. 1.

FIG. 3 is a cross-sectional view taken along the line B-B of FIG. 1. In FIG. 3, the pixel electrode 101 is formed on the TFT substrate 100, and the gate insulating film 102 is formed thereon. The through-holes 110 are formed in the gate insulating film 102 at areas where the pixel electrode 101 faces the common electrode 107. The inorganic passivation film 106 is formed on the gate insulating film 102, and the common electrode 107 is formed thereon. As shown in FIG. 3, no through-holes 110 are formed in the gate insulating film 102 at areas corresponding to the slits 1071 of the common electrode 107. In FIG. 3, only the inorganic passivation film 106 is provided between the pixel electrode 101 and the common electrode 107, and thus the distance between the pixel electrode 101 and the common electrode 107 is shortened, resulting in an increase in the pixel capacity.

Figure 4:
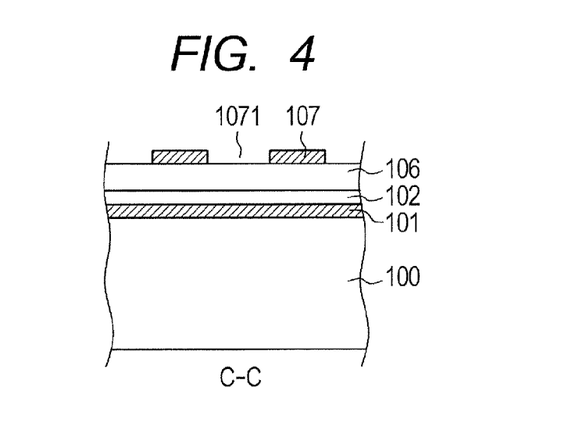
FIG. 4 is a cross-sectional view taken along the line C-C of FIG. 1.

FIG. 4 is a cross-sectional view taken along the line C-C of FIG. 1. FIG. 4 is a cross-sectional view of an area where no through-holes 110 are formed in the gate insulating film 102. In FIG. 4, the pixel electrode 101 is formed on the TFT substrate 100, and the gate insulating film 102 is formed thereon. On the gate insulating film 102, the inorganic passivation film 106 is formed. The common electrode 107 is formed on the inorganic passivation film 106. In FIG. 4, the gate insulating film 102 and the inorganic passivation film 106 are formed between the pixel electrode 101 and the common electrode 107. Thus, the pixel capacity in the area is the same as the conventional case, and is smaller than that of FIG. 3. According to the present invention, the through-holes 110 are partially formed in the gate insulating film 102 at areas where the pixel electrode 101 faces the common electrode 107, and the distance between the pixel electrode 101 and the common electrode 107 is shortened. Thus, the pixel capacity can be increased. Further, the through-holes 110 for the gate insulating film 102 can be simultaneously formed with those for contact between the source electrode 105 and the pixel electrode 101. Thus, the number of manufacturing steps is not increased. As a result, even if the present invention is applied, it is possible to prevent the manufacturing cost from increasing.

Second Embodiment

Figure 5:
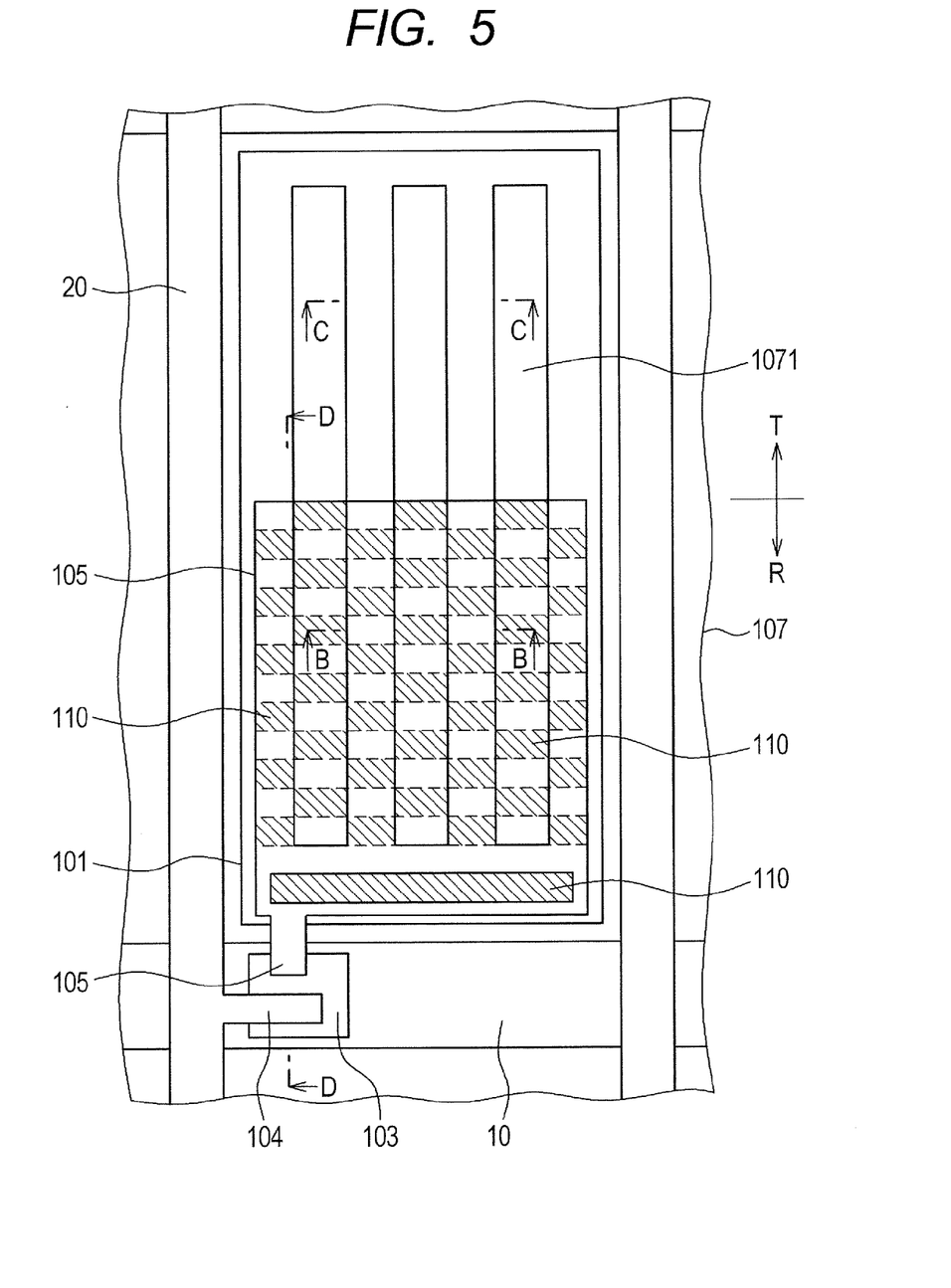
FIG. 5 is a plan view of a pixel of a liquid crystal display device in a second embodiment.

FIG. 5 shows an example of applying the present invention to a semi-transmissive liquid crystal display device. In FIG. 5, a pixel is provided in an area surrounded by the scanning lines 10 and the video signal lines 20. The lower side of the pixel of FIG. 5 is a reflective area R, and the upper side thereof is a transmissive area T. In FIG. 5, the configuration of the transmissive area T is the same as that in the conventional example. The through-holes 110 are formed in the gate insulating film 102 in the reflective area R, and the source electrode 105 is formed while covering the gate insulating film 102 and the through-holes 110. The cross-section taken along the line B-B of FIG. 5 is the same as that of FIG. 3, and the cross-section taken along the line C-C of FIG. 5 is the same as that of FIG. 4.

In FIG. 5, the source electrode 105 is formed on the entire reflective area to serve as a reflective electrode. The source electrode 105 is made of CrMo, and thus is sufficient in reflection characteristics. In FIG. 5, the through-holes 110 of the gate insulating film 102 are formed at pitches smaller than those in the case of the first embodiment. Accordingly, the surface of the source electrode 105 formed on the gate insulating film 102 and the through-holes 110 is uneven. Thus, the reflective electrode formed of the source electrode 105 is configured to have not a mirror surface but a diffuse reflection surface by which light can be reflected in a wide range.

In the embodiment, the extended source electrode 105 is made uneven to form the diffuse reflection surface. Thus, the through-holes 110 are formed in the gate insulating film 102 at areas corresponding to the slits 1071 of the common electrode 107. If the through-holes 110 are formed in the gate insulating film 102 at areas corresponding to the slits 1071, the pixel capacity is not increased. However, the diffuse reflection surface can be more advantageously formed. It should be noted that the positions of the through-holes 110 of the gate insulating film 102 are shifted from the striped common electrode 107 sandwiched between the slits 1071. Accordingly, the diffuse reflection surface of the source electrode 105 can be more advantageously formed.

Figure 6:
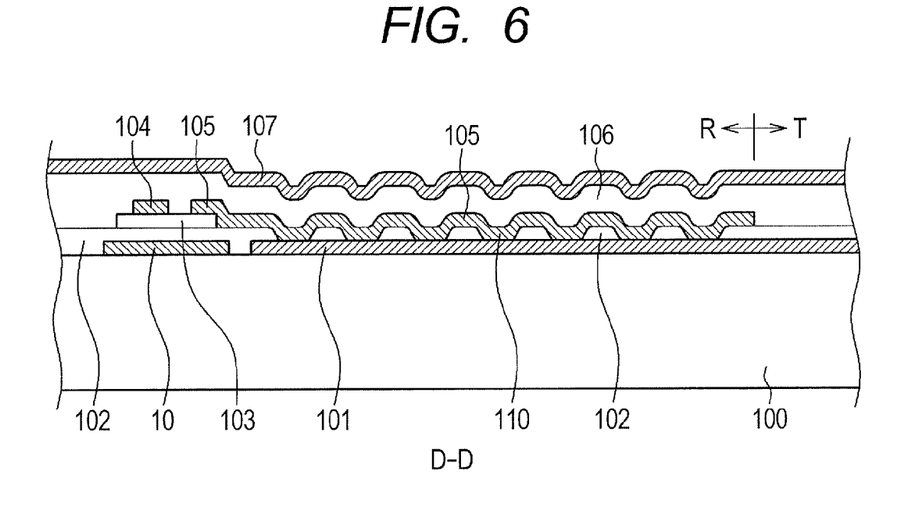
FIG. 6 is a cross-sectional view taken along the line D-D of FIG. 5.

FIG. 6 is a cross-sectional view taken along the line D-D of FIG. 5. In FIG. 6, the gate insulating film 102, the drain electrode 104, and the source electrode 105 are formed on the scanning line 10 that also serves as a gate electrode to configure a TFT. The left side near the TFT in the display area is the reflective area R. The through-holes 110 are formed at small pitches in the gate insulating film 102 formed on the pixel electrode 101 in the reflective area R. The source electrode 105 extends while covering the plural through-holes 110. The right side of FIG. 6 is the transmissive area T. In this area, the gate insulating film 102 is formed while covering the pixel electrode 101 as similar to the conventional case.

The inorganic passivation film 106 is formed while covering the TFT, the source electrode 105, the gate insulating film 102 and the like. On the inorganic passivation film 106, formed is the common electrode 107. In FIG. 6, only the inorganic passivation film 106 is provided between the source electrode 105, namely, the pixel electrode 101 and the common electrode 107 on the side of the reflective area R, and thus the capacity is large. On the other hand, the inorganic passivation film 106 and the gate insulating film 102 are provided between the pixel electrode 101 and the common electrode 107 in the transmissive area T, and thus the capacity is smaller than that in the reflective area R. However, the pixel capacity can be increased in the reflective area R, and thus the pixel capacity as the entire pixel can be increased.

In the embodiment, the reflective electrode for isotropically reflecting light is formed by forming the plural through-holes 110 in the gate insulating film 102. Thus, a step of forming the reflective electrode is not added. Further, only one layer of the inorganic passivation film 106 is provided between the source electrode 105, namely, the pixel electrode 101 and the common electrode 107 in the reflective area R, and thus the pixel capacity can be increased in the semi-transmissive liquid crystal display device.

Third Embodiment

Figure 7:
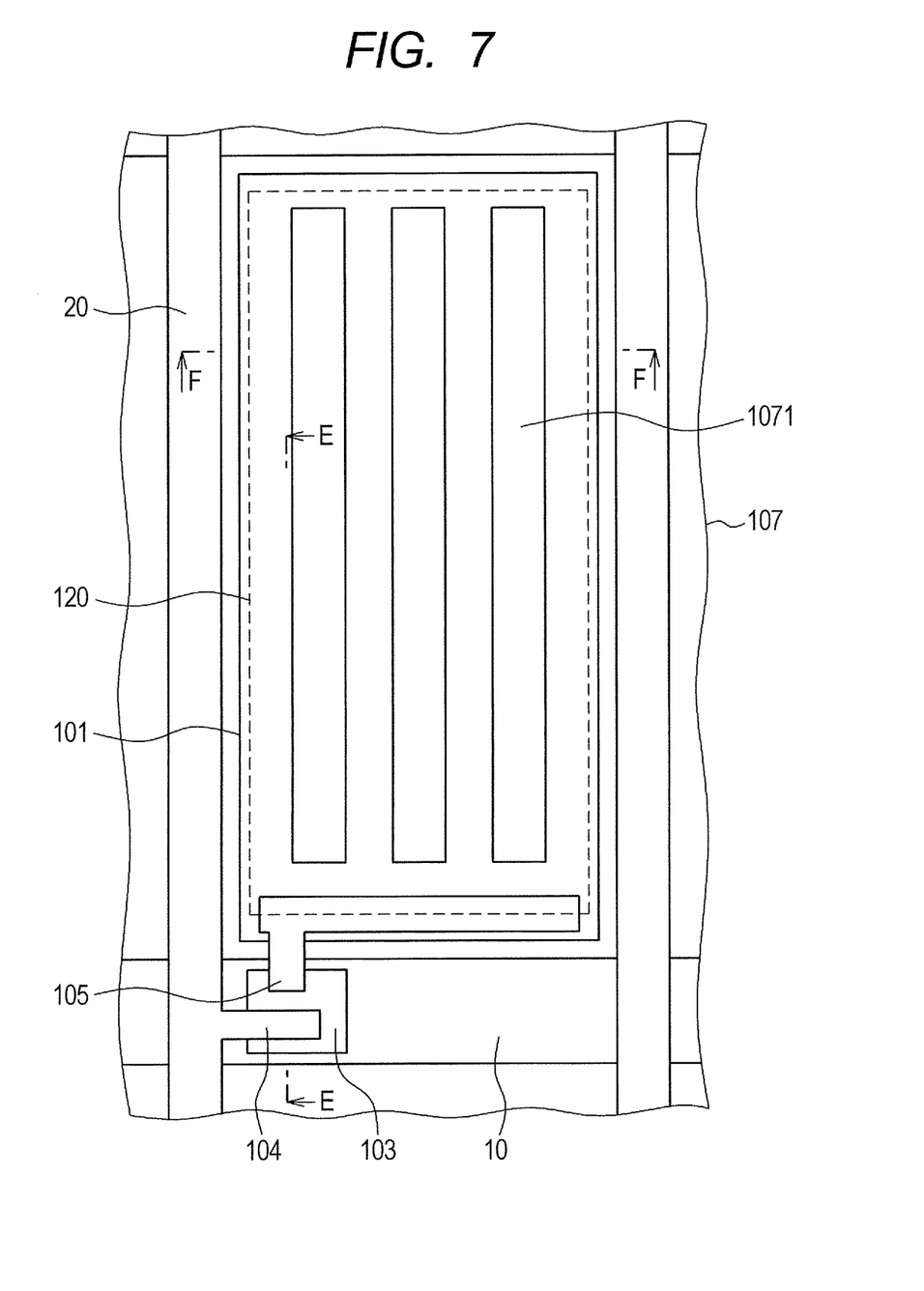
FIG. 7 is a plan view of a pixel of a liquid crystal display device in a third embodiment.

FIG. 7 is a plan view for showing a third embodiment of the present invention. In FIG. 7, a pixel is provided in an area surrounded by the scanning lines 10 and the video signal lines 20. FIG. 7 is different from FIG. 1 of the first embodiment in that the gate insulating film 102 is widely removed in the pixel area. In FIG. 7, the area surrounded by a dotted line is a gate insulating film removed area 120. The source electrode 105 extends to the gate insulating film removed area 120 to conduct the pixel electrode 101 and the source electrode 105.

Figure 8:
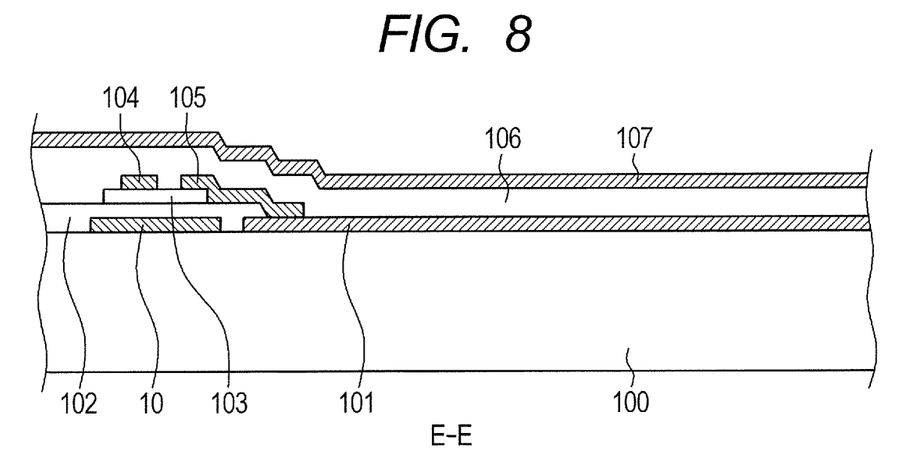
FIG. 8 is a cross-sectional view taken along the line E-E of FIG. 7.

FIG. 8 is a cross-sectional view taken along the line E-E of FIG. 7. In FIG. 8, the gate insulating film 102 covers the scanning line 10 that also serves as a gate electrode and an end of the periphery of the pixel electrode 101. However, the inner area thereof is widely removed. In an area where the gate insulating film 102 is removed, only the inorganic passivation film 106 is provided between the pixel electrode 101 and the common electrode 107, and thus the pixel capacity is larger than that in the conventional example or the first embodiment.

Figure 9:
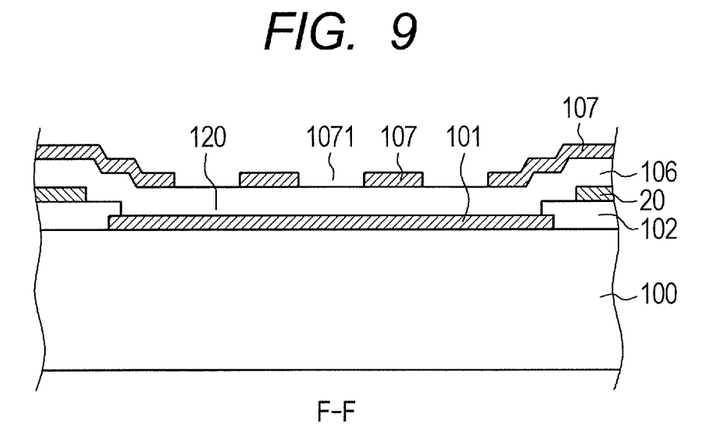
FIG. 9 is a cross-sectional view taken along the line F-F of FIG. 7.

FIG. 9 is a cross-sectional view taken along the line F-F of FIG. 7. In FIG. 9, the pixel electrode 101 is formed on the TFT substrate 100. The gate insulating film 102 is formed on the pixel electrode 101. However, the gate insulating film 102 is widely removed on the pixel electrode 101, and is provided only at ends and outsides of the pixel electrode 101. The video signal lines 20 are formed on the gate insulating films 102 outside the pixel electrode 101.

The inorganic passivation film 106 is formed while covering the video signal lines 20, the gate insulating films 102, and the pixel electrode 101. The common electrode 107 having the slits 1071 is formed on the inorganic passivation film 106 in the pixel area. In FIG. 9, only the inorganic passivation film 106 is formed between the pixel electrode 101 and the common electrode 107 in the pixel area, and thus the pixel capacity is large.

However, a step of the common electrode 107 becomes high around the gate insulating film removed area 120 in the configuration of the third embodiment. Specifically, the height of the step is equal to the heights of the gate insulating film 102 and the video signal line 20. If the step of the common electrode 107 is high, a step of an orientation film (not shown) formed thereon also becomes high. Accordingly, domains of liquid crystal easily occur in the area, possibly leading to deterioration in image quality.

In order to prevent this problem, the gate insulating films 102 are left around the pixel electrode 101 as shown in FIG. 9 in the third embodiment. Accordingly, the height of the step of the common electrode 107 can be reduced by at least the thickness of the pixel electrode 101. As described above, only the inorganic passivation film 106 is provided between the pixel electrode 101 and the common electrode 107 in most areas except the periphery of the pixel electrode 101 in the configurations of FIG. 7 to FIG. 9. Thus, an increase in the pixel capacity has an extremely great effect.

FIG. 10 shows a modified example of the embodiment. In FIG. 10, the through-holes 110 are formed in the gate insulating film 102 while being associated with the striped common electrode 107 between the slits 1071. In FIG. 10, the large capacity can be formed in substantially the entire area of two striped common electrodes 107, and thus large capacity can be formed as the entire pixel. The cross-section taken along the line C-C of FIG. 10 is the same as that of FIG. 4. The third embodiment is different from the first embodiment in that the large through-holes 110 are continuously formed in the gate insulating film 102 at areas corresponding to the pixel electrode 101.

Further, no through-holes 110 are formed in the gate insulating films 102 corresponding to the both sides of the common electrode 107 in the configuration of FIG. 10. Thus, large steps generated by the both of the video signal lines 20 and the gate insulating films 102 are not formed. The steps in the areas of FIG. 10 are only steps generated by the video signal lines 20. Accordingly, the problem of occurrence of domains of liquid crystal is eased as compared to the configuration of FIG. 7.

What is claimed is:

1. A liquid crystal display device comprising:
a TFT (thin-film transistor) substrate on which pixels having pixel electrodes and TFTs are formed in a matrix shape;
an opposed substrate having color filters; and
liquid crystal sandwiched between the TFT substrate and the opposed substrate,
wherein a pixel electrode is formed on the TFT substrate, a gate insulating film is formed on the pixel electrode, an inorganic passivation film is formed on the gate insulating film, and a common electrode having slits is formed on the inorganic passivation film;
a video signal is supplied to the pixel electrode from a source electrode of a TFT through a first through-hole of the gate insulating film;
a second through-hole is formed in the gate insulating film at a position where the pixel electrode faces the common electrode, and the pixel electrode and the source electrode are not connected to each other in the second through-hole;
the inorganic passivation film is formed in the second through-hole; and
the common electrode is formed on the inorganic passivation film at an area corresponding to the second through-hole.

2. The liquid crystal display device according to claim 1, wherein the plural second through-holes are formed in the gate insulating film at areas corresponding to the striped common electrode sandwiched between the slits.

3. The liquid crystal display device according to claim 2, wherein the plural through-holes are formed at predetermined pitches.

4. The liquid crystal display device according to claim 2, wherein no through-holes are formed in the gate insulating film at areas corresponding to the slits of the common electrode.

5. A liquid crystal display device comprising:
a TFT (thin-film transistor) substrate on which pixels are formed in a matrix shape, each of the pixels having a pixel electrode and a TFT, and having a transmissive area and reflective area;
an opposed substrate having color filters; and
liquid crystal sandwiched between the TFT substrate and the opposed substrate,
wherein in the reflective area, a pixel electrode is formed on the TFT substrate, a gate insulating film is formed on the pixel electrode, and plural through-holes are formed in the gate insulating film;
a source electrode extending from a TFT is formed while covering the gate insulating film and the plural through-holes;
an inorganic passivation film is formed while covering the source electrode, and a common electrode having slits is formed on the inorganic passivation film;
the source electrode is conductive with the pixel electrode in the plural through-holes of the gate insulating film; and
the source electrode formed on the gate insulating film and the plural through-holes forms a diffuse reflection surface.

6. The liquid crystal display device according to claim 5, wherein the plural through-holes formed in the gate insulating film are also formed at areas corresponding to the slits.

7. A liquid crystal display device comprising:
a TFT (thin-film transistor) substrate on which pixels having pixel electrodes and TFTs are formed in a matrix shape;
an opposed substrate having color filters; and
liquid crystal sandwiched between the TFT substrate and the opposed substrate,
wherein a pixel electrode is formed on the TFT substrate;
a gate insulating film is formed while covering a periphery of the pixel electrode;
no gate insulating film is provided on the inner side relative to the periphery of the pixel electrode and an inorganic passivation film is directly formed on the pixel electrode; and
a common electrode having slits is formed on the inorganic passivation film.

8. A liquid crystal display device comprising:
a TFT (thin-film transistor) substrate on which pixels having pixel electrodes and TFTs are formed in a matrix shape;
an opposed substrate having color filters; and
liquid crystal sandwiched between the TFT substrate and the opposed substrate,
wherein a pixel electrode is formed on the TFT substrate, a gate insulating film is formed on the pixel electrode, an inorganic passivation film is formed on the gate insulating film, and a common electrode having plural slits is formed on the inorganic passivation film;
a video signal is supplied to the pixel electrode from a source electrode of a TFT through a first through-hole of the gate insulating film; and
an area with the gate insulating film removed is formed at a position where the pixel electrode faces the common electrode, and the inorganic passivation film is directly formed on the pixel electrode at the area with the gate insulating film removed.

9. The liquid crystal display device according to claim 8, wherein the area with the gate insulating film removed is an area corresponding to the striped common electrode sandwiched between the slits.

* * * * *